United States Patent [19]
Lipkin et al.

[11] Patent Number: 5,972,801
[45] Date of Patent: Oct. 26, 1999

[54] PROCESS FOR REDUCING DEFECTS IN OXIDE LAYERS ON SILICON CARBIDE

[75] Inventors: Lori A. Lipkin; David B. Slater, Jr.; John W. Palmour, all of Raleigh, N.C.

[73] Assignee: Cree Research, Inc., Durham, N.C.

[21] Appl. No.: 08/554,319

[22] Filed: Nov. 8, 1995

[51] Int. Cl.$^6$ ........................ H01L 31/0312; H01L 21/20
[52] U.S. Cl. ............................ 438/770; 438/931; 257/77
[58] Field of Search .................................. 437/770, 773; 438/770, 931; 257/77

[56] References Cited

U.S. PATENT DOCUMENTS

| | | | |
|---|---|---|---|
| 4,994,413 | 2/1991 | Eshita | 437/244 |
| 5,459,107 | 10/1995 | Palmour | 438/763 |
| 5,506,421 | 4/1996 | Palmour | 257/77 |
| 5,610,411 | 3/1997 | Takasu | 257/77 |

OTHER PUBLICATIONS

Hornetz, R. et al, J. Mater. Res. 1994, 9(12), pp. 3088–3094.

Wet and Dry Oxidation of Single Crystal 8–SiC: Kinetics and Interface Characteristics, J. W. Palmour et al., Mat.Res. .Soc.Symp.Proc., vol. 54, Materials Research Society, 1986, pp. 553–559.

High Quality $SiO_2$/Si Interfaces of Poly–Crystalline Silicon Thin Film Transistors by Annealing in Wet Atmosphere, N. Sano et al., IEEE Electron Device Letters, vol. 16, No. 3, May 1995, pp. 157–160.

Electrical Characterization of the Thermally Oxidized $SiO_2$/SiC Interface, J. N. Shenoy et al., Inst.Phys.Conf.Ser. No. 141, Chapter 4, pp. 449–455 (Symp.Compound Semicond., San Diego, Sep. 1994).

International Search Report, PCT/US 96/17344, dated Jan. 14, 1997, by E. Hammel.

Fundamental Oxidation Studies of Single Crystal SiC, Z. Zheng et al., 1046b Extended Abstracts, Fall Meeting, Hollywood, FL, US 89/2 (1989), pp. 720–721.

High Frequency Capacitance–Voltage Characteristics of Thermally Grown $SiO_2$ Films on β–SiC, S. M. Tang et al., J. Electrochem. Soc., vol. 137, No. 1, Jan. 1990, pp. 221–225.

*Primary Examiner*—Ceila Chang
*Attorney, Agent, or Firm*—Philip Summa

[57] ABSTRACT

A method is disclosed for obtaining improved oxide layers and resulting improved performance from oxide based devices. The method comprises exposing an oxide layer on a silicon carbide layer to an oxidizing source gas at a temperature below the temperature at which SiC would begin to oxidize at a significant rate, while high enough to enable the oxidizing source gas to diffuse into the oxide layer, and while avoiding any substantial additional oxidation of the silicon carbide, and for a time sufficient to densify the oxide layer and improve the interface between the oxide layer and the silicon carbide layer.

34 Claims, 4 Drawing Sheets

PROCESS FOR REDUCING DEFECTS IN OXIDE LAYERS ON SILICON CARBIDE

This invention was developed under the Office of Naval Research, Contract No. N00014-93-C-0071. The government may have rights in this invention.

FIELD OF THE INVENTION

The present invention relates to an improved method for forming oxides on silicon carbide semiconductor material, and in particular relates to improving the oxides and the oxide interfaces in silicon carbide based metal oxide semiconductor (MOS) devices.

BACKGROUND OF THE INVENTION

Silicon carbide (SiC) has a combination of electrical and physical properties that make it attractive for a semiconductor material for high temperature, high voltage, high frequency and high power electronic devices. These properties include a 3.0 electron-volt (eV) bandgap, a 4 millivolt per centimeter (MV/cm) electric field breakdown, a 4.9 W/cm·K thermal conductivity, and a $2.0 \times 10^7$ centimeter per second (cm/s) electron drift velocity. Furthermore, because SiC will grow thermal oxides, it offers significant advantages over other compound semiconductors. In particular, the ability to form a thermal oxide raises the corresponding ability to form metal-oxide-semiconductor (MOS) devices, including MOS field-effect transistors (MOSFETS) insulated gate bipolar transistors (IGBT's), MOS-controlled thyristors (MCTs), and other related devices. In turn, MOSFETs are extremely important devices in large scale integrated circuits. Accordingly, taking full advantage of SiC's electronic properties in MOS devices and resulting integrated circuits requires appropriate SiC oxidation technology.

In spite of these advantageous characteristics, the quality of oxides on silicon carbide (SiC) has been a major obstacle to developing silicon carbide MOS devices. Oxide charge and interface states in particular, have an adverse effect on MOS device performance. Indeed, with the exception of substrate crystal growth, oxide quality is perhaps the largest barrier to advanced SiC MOS power devices and MOS integrated circuits. Oxides on SiC have been widely reported to have unacceptably high interface state densities and fixed oxide charge for MOS applications.

As used herein, the term "state" refers to a characteristic of a material, such as an available energy level position, and often defined using quantum mechanics. The existence of "states" in materials is not necessarily good or bad, and their presence or absence is probably better defined as desired or undesired. In the case of oxide layers on silicon carbide, the states appear to produce undesired operating characteristics in resulting devices, and thus are desirably minimized whenever possible.

Previous work comparing thermal oxidation techniques and investigating $SiC/SiO_2$ defects have led to only a few general observations: (1) wet oxides (i.e. those thermally grown in the presence of water vapor) have lower oxide charge and interface state densities than dry oxides (S. M. Tang, W. B. Berry, R. Kwor, M. V. Zeller and L. G. Matus, J. Electrochem. Soc., 137(1) p.221 (1990); S. Zaima, K. Onoda, Y. Koide, and Y. Yasuda, J. Appl. Phys., 68(12) p. 6304 (1990)); (2) the Si-face of SiC wafers oxidizes more slowly, but has lower oxide charge densities, than the carbon (C) face (Nitya N. Singh and Andrew Rys, Inst. Phys. Conf. Ser. No 137: Chapter 3, p. 325 (1993)); (3) oxides grown on n-type wafers have fewer interface states (Dale M. Brown, Mario Ghezzo, James Kretchmer, Evan Downey, Joseph Pimbley, and John Palmour, IEEE Trans on Electron Devices, Vol. 41, No. 4, p. 618 (1994)); T. Ouisse, N. Becourt, F. Templier, C. Jaussaud, J. Appl. Phys. 75(1) (1994); Singh, supra) and lower oxide charge densities (Brown, supra; M. Shinohara, M. Yamanoka, S. Misawa, H. Okumura, S. Yoshida, Jap.J.Appl.Phys. 30(2) p.240 (1991); Singh, supra) than those grown on p-type wafers; and (4) contrary to early projections (Brown, supra), there is no difference between boron (B) and aluminum (Al) as a p-type dopant in SiC (J. N. Shenoy, L. A. Lipkin, G. L. Chindalore, J. Pan, J. A. Cooper, Jr., J. W. Palmour, and M. R. Melloch, Inst. Phys. Conf. Ser. No 141: Chapter 4, p. 449 (1994)).

It will be understood that for the most part, the accuracy of these measurements and the resulting conclusions can vary to a greater or lesser extent, and should be evaluated and understood in that light.

Although these particular conclusions are widely accepted, the quantification of the net oxide charge ($Q_{ox}$) and interface state densities ($D_{it}$) has varied widely, even when measuring the same crystal orientation, oxide thickness, dopant type and dopant species. These variations are demonstrated in Table 1, which summarizes the oxide charge and interface state densities of $SiO_2$ on SiC as reported by various authors. The reported oxide thicknesses range from 500–600 Å, except for the 200 Å oxides on n-type samples of reference reported by Weiss, supra.

TABLE 1

| Substrate/Oxide | $Q_{ox}$ ($cm^{-2}$) | $D_{it}$ ($cm^{-2}eV^{-1}$) |
| --- | --- | --- |
| N-6H/dry | $0-1 \times 10^{11}$ | $0.5-5 \times 10^{12}$ |
| N-6H/wet | negligible | $0-2 \times 10^{11}$ |
| p-6H/wet | mid $10^{12}$ | $0.15-5 \times 10^{12}$ |

These seemingly inconsistent results probably reflect the variety of measurement techniques used. As Table 1 demonstrates, the largest variations are in the reported interface state densities. The net oxide charge is straightforward to measure with a standard capacitance-voltage (CV) sweep at room temperature. Accurately calculating the interface state density, however, can be quite challenging. Raynoud et al. (Christophe Raynoud, Jean-Lun Autran, Bernard Balland, Gerard Guillot, Claude Jaussaud and Thierry Billon, J. Appl. Phys. 76 (2) p. 993 (1994)); Shenoy, supra; and Ouisse, supra; have discussed the various methods that can be used and the assumptions and limitations that must be taken into account when determining interface state densities. Of all the different techniques, the conductance and high-low techniques seem to be the most consistent and repeatable.

Although the reported quantities of oxide defects vary significantly from group to group, the goals for high quality MOS applications are fairly well defined: Oxide charge less than $1 \times 10^{11}$ $cm^{-2}$ and interface states less than $5 \times 10^{10}$ $cm^{-2}eV^{-1}$. As Table 1 demonstrates, the quality of thermal oxides on SiC needs dramatic improvement. There are, however, few reported techniques for improving oxide quality. To date, the largest improvements result from varying the insert/withdrawal conditions of the oxidation and the oxidation pre-clean. Shenoy et al. (J. N. Shenoy, G. L. Chindalore, M. R. Melloch, J. A. Cooper, Jr., J. W. Palmour, and K. G. Irvine Inst. Phys. Conf. Ser. No 141: Chapter 4, p. 449 (1994)) also report a minimum net oxide charge density of $9 \times 10$ $cm^{-2}$, and a interface state density of $1.5 \times 10^{11}$ $cm^{-2}eV^{-1}$, which are 3–4 times lower than their earlier oxidation conditions.

OBJECT AND SUMMARY OF THE INVENTION

Therefore, it is an object of the present invention to further improve the quality of SiC oxides. The invention meets this object with a method for obtaining improved oxide layers and resulting improved performance from oxide based devices. The method comprises exposing an oxide layer (existing, deposited, nitrided, or thermally grown, and typically predominantly silicon dioxide) on a silicon carbide layer to an oxidizing source gas at a temperature below the temperature at which SiC would begin to oxidize at a significant rate, while high enough to enable the oxidizing source gas to diffuse into the oxide layer, and while avoiding any substantial additional oxidation of the silicon carbide, and for a time sufficient to densify the oxide layer and improve the interface between the oxide layer and the silicon carbide layer.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
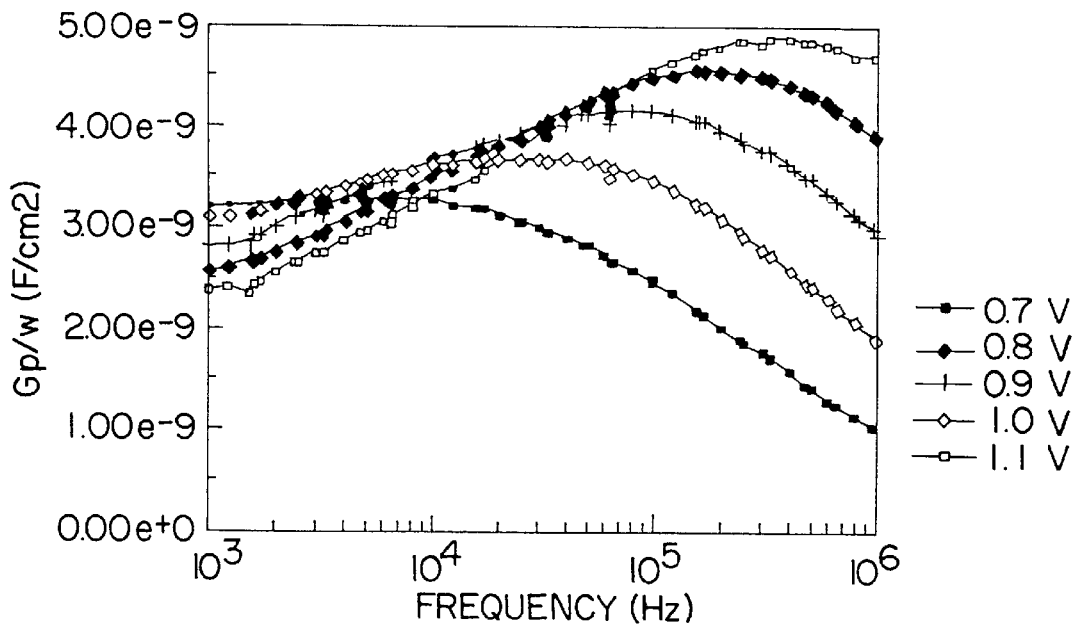
FIG. 1 is a plot of several equivalent parallel conductance (Gp/w) versus frequency curves taken at 250° C. at several biases on the best oxide grown at 1050° C. The calculated interface state densities varied from $1.0–1.6\times10^{11}$ cm$^{-2}$eV$^{-1}$, on the 1.1V and 0.7 V curves respectively.

In a first embodiment the invention comprises a method of obtaining improved oxide layers and resulting improved performance from oxide based devices. The method comprises exposing an oxide layer (predominantly silicon dioxide) on a silicon carbide layer to an oxidizing source gas (also referred to as an "oxidizing atmosphere") at a temperature below the temperature at which silicon carbide would begin to oxidize at a significant rate, while high enough to enable the oxidizing source gas to diffuse into the oxide layer. Any substantial additional oxidation of the silicon carbide is avoided, and the exposure is carried out for a time sufficient to densify the oxide layer and improve the interface between the oxide layer and the silicon carbide layer.

In this regard, it is generally accepted that silicon carbide oxidizes only at negligible or very slow rates until the temperature reaches about 1000° C., after which thermal oxidization occurs on a more measurable basis. Even at 1050° C., however, oxidizing a 500 Å layer can take as long as 20–30 hours.

Accordingly, the method can further include the step of producing the oxide layer prior to the exposure step, and if silicon carbide is thermally oxidized in accordance with the present invention, the oxidizing temperature is at least 1000° C. and preferably between about 1050° C. and 1300° C.

It will be understood, however, that the method of exposing the oxide layer on the silicon carbide layer to an oxidizing source gas does not require that the oxide layer have been first produced by thermal oxidation. Alternatively, the oxide layer could be produced by other methods such as depositing an oxide layer on the silicon carbide layer for example using low pressure chemical vapor deposition (CVD) with silane gas ($SiH_4$), and oxygen ($O_2$) plasma deposited oxides, deposited oxynitrides, thermal oxynitrides, or any combination of deposited or thermal layers of oxides, nitrides, or oxynitrides.

As used herein, the term "oxynitride" will refer to oxide layers that have been exposed to nitrous oxide ($N_2O$) at high temperature to incorporate nitrogen, oxide layers grown in $N_2O$ to incorporate nitrogen, and alternating layers (or other combinations) of silicon dioxide ($SiO_2$) and silicon nitride ($Si_3N_4$).

As used herein, the term "silicon carbide layer" most preferably refers to either a single crystal silicon carbide substrate or a silicon carbide epitaxial layer. Silicon carbide has a number of polytypes, of which the 3C, 4H, 6H, and 15R polytypes are particularly useful in electronic devices, and the invention produces suitable results in these various polytypes.

As noted above, because the oxidation rate of SiC is negligible below about 1000° C., the step of exposing the oxide to the oxidizing atmosphere is preferably carried out at between about 800° C. and 1025° C. In general terms, the approximate upper limit of 1025° C. prevents any substantial oxidation of the silicon carbide, while the approximate minimum temperature of 800° C. enables the process to take place at reasonable rates, it being understood that all chemical reactions take place to some degree over a wide range of temperatures, but for practical purposes only proceed at macroscopically observable rates within more narrow temperature ranges.

In this regard, and as generally well understood by those familiar with silicon carbide, a crystal substrate or epilayer is usually presented for oxidation (or for deposition of oxides) along either its silicon face, its carbon face, or along one of the A-axes (e.g. [11$\bar{2}$0] or [1$\bar{1}$00]) perpendicular to these faces. Because carbon oxidizes somewhat more easily than silicon (and thus faster if all other factors are substantially equal), the oxidation on the carbon face can be carried out at temperatures of between about 900 and 1300° C., and the reoxidation anneal can be carried out at temperatures of between about 600 and 1000° C. Similarly, the oxidation on the silicon face can be carried out at temperatures of between about 1000 and 1400° C., and the reoxidation anneal can be carried out at temperatures of between about 700 and 1100° C. to obtain the same degree of oxidation at about the same rate.

The oxygen containing gas can be any oxygen containing gas that does not otherwise interfere with the chemical, physical or electronic characteristics of either the oxide or the silicon carbide layers. Appropriate gases can be selected from among oxygen, water vapor, oxygen in water vapor ("wet oxidation"), water vapor in a carrier gas, the various gas compounds formed from nitrogen and oxygen, and mixtures of any of these gases.

Accordingly, in a most preferred embodiment the method comprises thermally oxidizing a layer of silicon carbide at a temperature of about between 1050°0 C. and 1100° C. to produce the oxide layer on the layer of silicon carbide, and thereafter exposing the layers of oxide and silicon carbide to an oxidizing source gas at a temperature below about 1050° C. and most preferably about 950° C., in the presence of water (i.e. "wet oxidation"), and while avoiding any substantial oxidation of the silicon carbide, and for a time sufficient to densify the oxidizing layer and improve the interface between the oxide layer and the silicon carbide layer.

In another embodiment, the invention comprises an improved silicon carbide and oxide structure. In this embodiment, the invention comprises a silicon carbide substrate and an oxide layer on the silicon carbide substrate, with the oxide layer having an interface state density less than $1.6 \times 10^{11}$ per square centimeter per electron volt. In preferred embodiments, the interface state density is less than $1.5 \times 10^{11}$ per square centimeter per electron volt, and in the most preferred embodiments is less than $1.1 \times 10^{11}$ per square centimeter per electron volt.

As in the method aspects of the invention, the silicon carbide can be either an epitaxial layer or a substrate, and can preferably be selected from the group consisting of 2H, 3C, 4H, 6H and 15R polytypes.

In yet another embodiment, the invention comprises a silicon carbide and oxide structure in which the oxide layer on the silicon carbide substrate has an oxide charge less than $2.5 \times 10^{12}$ cm$^{-2}$. In more preferred embodiments, the oxide charge is less than $1.5 \times 10^{12}$ cm$^{-2}$ and in most preferred embodiments is less than $1.1 \times 10^{12}$ cm$^{-2}$.

As in the other embodiments, the silicon carbide comprises a single crystal with the polytype selected from the group consisting of 2H, 3C, 4H, 6H and 15R and can be either an epitaxial layer or a substrate.

EXPERIMENTAL PROCEDURES

Sample Preparation

Sample preparation began with p-type substrates doped with aluminum (Al) in the $1-2 \times 10^{18}$ cm$^{-3}$ range with 3 $\mu$m epitaxial layers doped between $2 \times 10^{15}$ and $3 \times 10^{16}$ cm$^{-3}$. The samples were cleaned with a typical RCA/Huang clean and then oxidized. Samples were either inserted at ambient temperature, and withdrawn at the oxidation temperature in argon, or had oxides deposited. Thermal oxidations were carried out at temperatures ranging from 1050° C. to 1300° C. in a wet environment created by bubbling oxygen through de-ionized water at 95° C. The oxidation times were adjusted to maintain a target oxide thickness of 500 Å, and varied from 450–550 Å. Deposited oxides had oxide thicknesses of about 350 Å. A one hour argon anneal followed oxidation at the oxidation temperature. Various post-oxidation annealing procedures in an oxidizing ambient were investigated on both thermal and deposited oxides by annealing at temperatures ranging from 800° C. to 1000° C. either in the same wet oxidation environment or in pure oxygen. This temperature range results in almost no further oxidation into the SiC substrate, but appears to complete the oxidation of any possible carbon compounds (B. Hornetz, H-J. Michel, J. Halbritter, *J. Mater. Res.*, 9 (12) p.3088 (1994)) and encourage proper oxide stoichiometry (1:2 Si:O).

After oxidation and any of the various anneals, the metal layer was sputtered onto the oxide for the front-side contact. The back-side oxide was etched off using reactive ion etching (RIE). Some samples also received a back-side contact of 200 nm of Pt sputtered, but it was later determined that this was unnecessary. The front, or "gate" contact of the thermally oxidized samples was then patterned and etched with a commercial aluminum etchant, which was found to be quite efficient at etching molybdenum. Square capacitors were patterned in three different sizes, 200 $\mu$m, 300 $\mu$m and 400 $\mu$m on a side with a large (>>100 times the area) contact nearby. The large front-side contact was used to make a contact to the substrate in parallel with the backside contact, which was found to minimize any effects from epitaxial layer non-uniformities or series resistance. Samples with deposited oxides were patterned by liftoff of molybdenum and gold (Mo/Au).

Oxide Quality Measurement

The net oxide charge was calculated from the flatband voltage (Vfb), determined by a room temperature high frequency (500 kHz) capacitance-voltage (C-V) sweep. Flatband voltage is affected by a combination of charge trapped in the oxide, mobile ions in the oxide, charged border traps (D. M. Fleetwood, *IEEE Trans. Nucl. Sci.*, NS-39 (12) p.269 (1992)), and charged interface states. Separating the different components on SiC capacitors is very difficult because of the wide band gap, but all of these effects can be considered together as a "net" oxide charge. Improvement in the sum of these effects is a necessary first step to improve device operation.

Interface state density was determined using the standard conductance technique (Nicollian, supra) at high temperature. Measurements were taken using an MDC CSM/2 system with an HP4284A capacitance meter. The capacitance and conductance were measured at a constant voltage across a frequency range of 1 kHz to 1 MHz. This was repeated at a variety of biases, and the band bending for each bias determined from the parallel capacitance. FIG. 1 shows the equivalent parallel conductance ($G_p/w$) versus frequency curves from the best oxide (discussed below), and corresponds to a minimum interface state density of $1.0 \times 10^{11}$ cm$^{-2}$eV$^{-1}$. The conductance technique was done at 250° C. to measure a wider region of the band gap than can be measured at room temperature, and to reduce the band bending variation for better signal resolution. Higher temperatures (up to about 350° C.) are preferable for measurement purposes, but the molybdenum gate oxidizes too rapidly at temperatures above 250° C.

RESULTS & DISCUSSION

Oxidation Temperature

Figure 2:
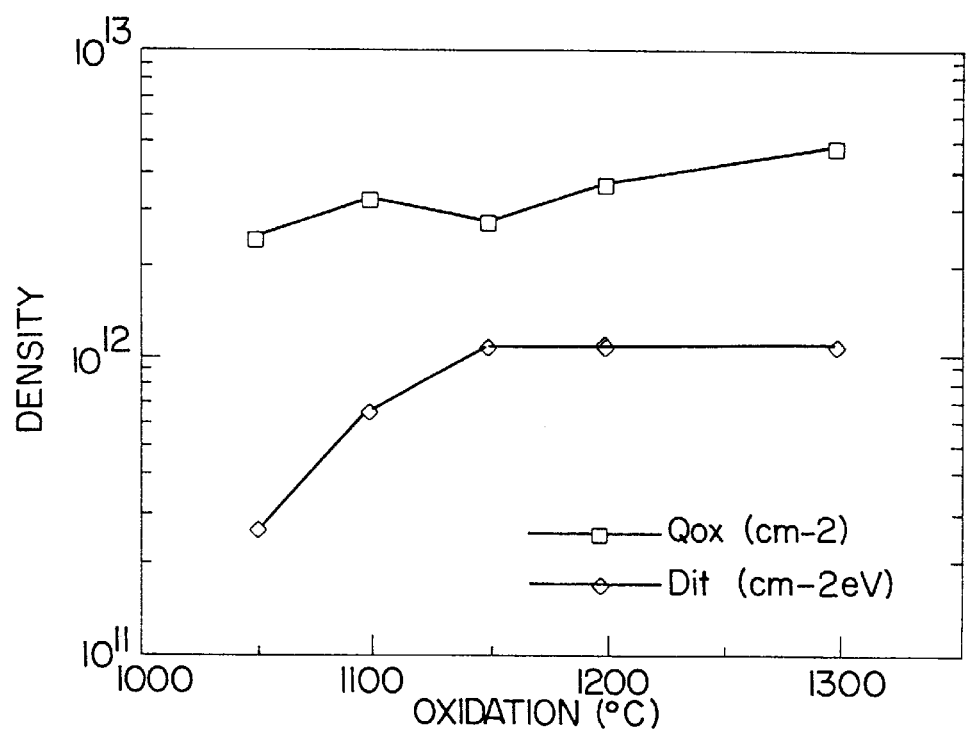
FIG. 2 is a plot of net oxide change ($Q_{eff}$) and interface state densities ($D_{IT}$) versus oxidation temperature for several oxidations performed across the usable temperature range.

A comparison of $D_{it}$ and $Q_{ox}$ for the oxides grown at temperatures between 1050° C. and 1300° C. is given in FIG. 2. All oxidations in FIG. 2 were produced in a wet environment and followed by a 1 hour argon anneal. FIG. 2 shows an increase in both $Q_{ox}$ and $D_{it}$ as the oxide temperature is increased. It is also interesting to note that the interface state density plateaus at about 1150° C. Because the oxidation times become excessively long, oxidation temperatures below 1050° C. are not very practical.

The oxide quality is dramatically improved by oxidizing at the lowest temperature possible. Although the oxidation time is quite lengthy at 1050° C., the improved oxide quality is well worth the invested time for most MOS device applications.

Re-Oxidation Anneal on Thermal Oxides

As set forth above, the invention comprises a post-oxidation treatment that is also beneficial to the oxide quality. This treatment consists of an oxidation performed at a lower temperature after the bulk of the oxide has been grown. This anneal is also referred to herein as a "re-oxidation" anneal. The temperature range of the re-oxidation anneal is between about 800° C. and 1000° C. This step oxidizes any impurities, e.g. residual carbon or dangling silicon bonds, but without oxidizing the SiC any further, and thus densifying the oxide, and improving the SiC/SiO$_2$ interface. Table 2 compares four samples with various post-oxidation treatments. The first row was not treated with a post-oxidation anneal. The second row was removed from the oxidation furnace using the "slow pull" procedure described by Shenoy, et al, supra. The last two rows had a wet or dry post-oxidation treatment at 900° C. for 1.5 hours. (The argon anneal is done in-situ with oxidation and is not considered a post-oxidation treatment for ease of discussion herein. All thermal oxides received this anneal immediately following oxidation and prior to any reoxidation anneal.)

TABLE 2

| Post-Oxidation | $Q_{ox}$ (cm$^{-2}$) | $D_{it}$(cm$^{-2}$/eV) |
| --- | --- | --- |
| None | 4.0 × 10$^{12}$ | 7.1 × 10$^{11}$ |
| Slow Pull | 2.3 × 10$^{12}$ | 3.2 × 10$^{11}$ |
| Wet | 1.5 × 10$^{12}$ | 2.8 × 10$^{11}$ |
| Dry | 3.9 × 10$^{12}$ | 1.5 × 10$^{12}$ |

As demonstrated by the data in Table 2, the slow pull procedure improves oxide quality, which is in agreement with Shenoy's results. Even higher oxide quality, as evidenced by lowered net oxide charge and interface state densities, is obtained by following a standard oxidation with a wet re-oxidation procedure. The dry re-oxidation anneal doubles the interface state densities, when compared with the oxide that received no post-oxidation treatment.

Figure 3:
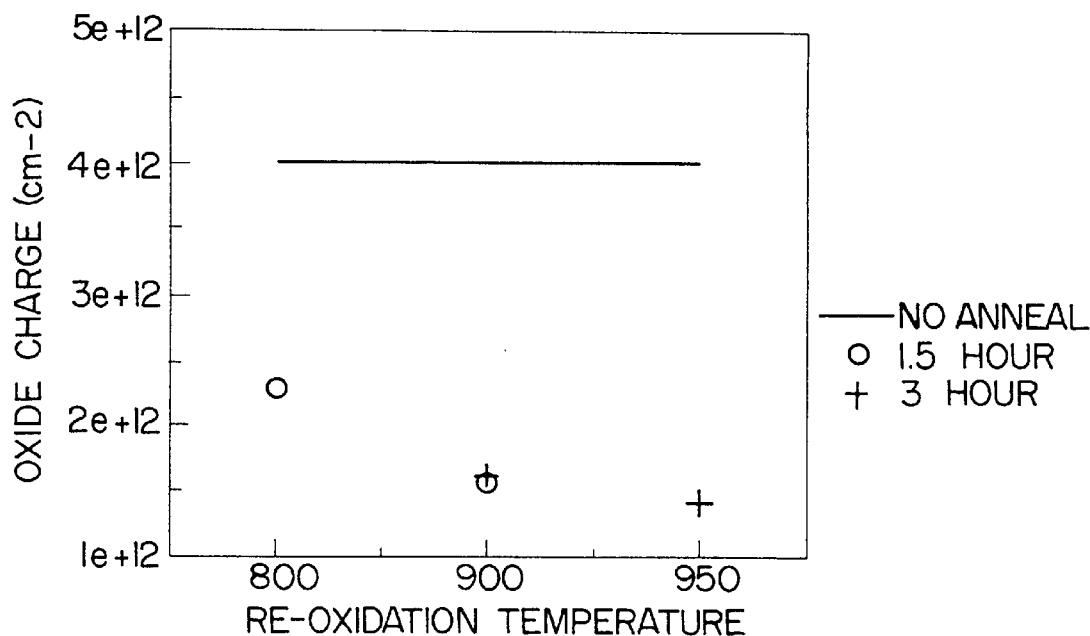
FIG. 3 is a comparison of net oxide charge densities on oxides grown at 1100° C., and then re-oxidized at 800°, 900°, and 950° C.
Figure 4:
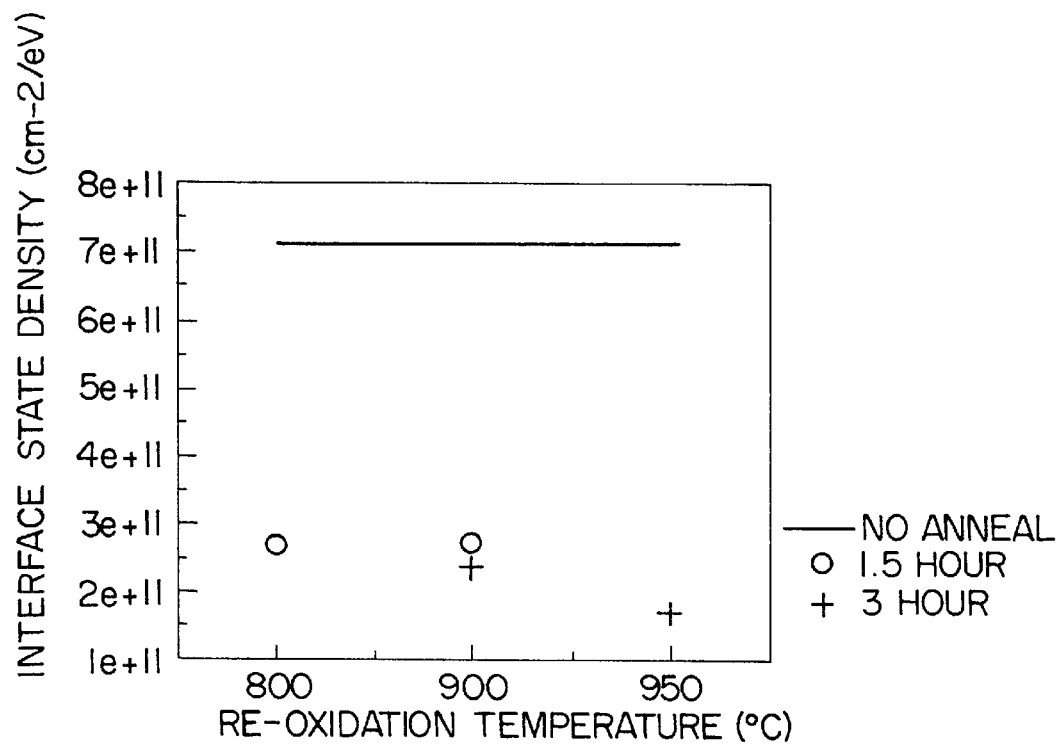
FIG. 4 is a comparison of interface state densities on oxides grown at 1100° C., and then re-oxidized at 800°, 900° and 950° C.

Attempts at optimizing both the time and temperature of the wet re-oxidation process were made on both 1050° C. and 1100° C. thermal oxides. FIGS. 3 and 4 demonstrate the net oxide charge and interface state densities of samples oxidized at 1100° C. that received various re-oxidation conditions. The temperature of the re-oxidation varied from 800° C. to 950° C., and oxidation times of 1.5 and 3 hours were investigated. The horizontal line indicates the densities of identically oxidized samples, but which had no re-oxidation anneal.

For the oxides grown at 1100° C., the oxide charge density varies the most with the temperature of the re-oxidation anneal. The time of the re-oxidation anneal has almost no effect on the net oxide charge density, as seen by comparing the 1.5 and 3 hour data points at 900° C. in FIG. 3. Comparing the two 900° C. points in FIG. 4, however, it seems that the longer anneal times are slightly better than the shorter anneal times. The interface state density is strongly affected by the re-oxidation anneal temperature. For the 1100° C. oxide, the longer times and 950° C. temperature produce the best oxide, which results in lowering net oxide charge density by a factor of 2.5 and interface state densities by a factor of 4.

Figure 5:
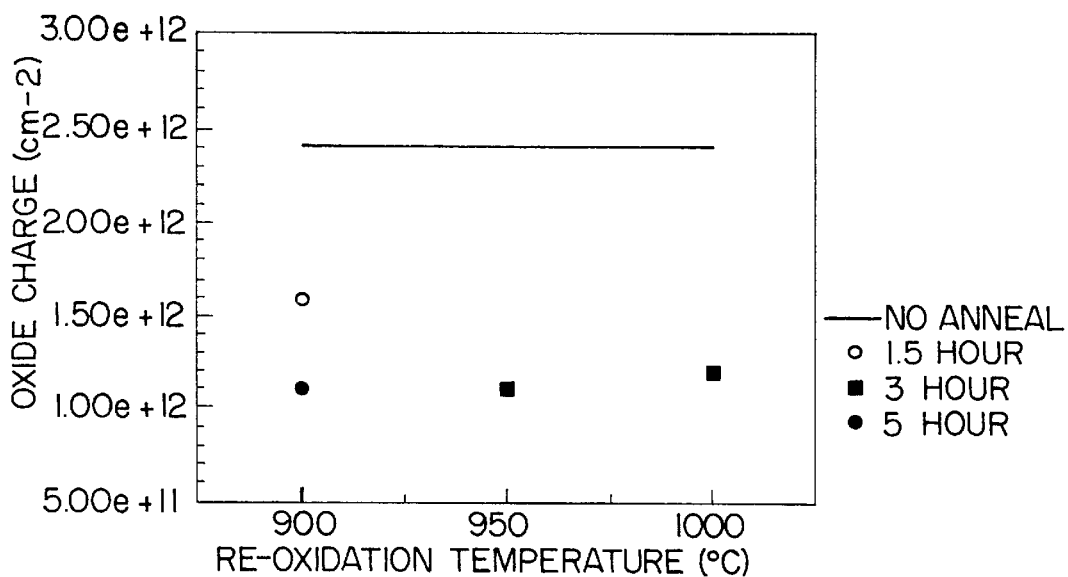
FIG. 5 is a comparison of net oxide charge densities on oxides grown at 1050° C., and then re-oxidized at 900°, 950° and 1000° C.
Figure 6:
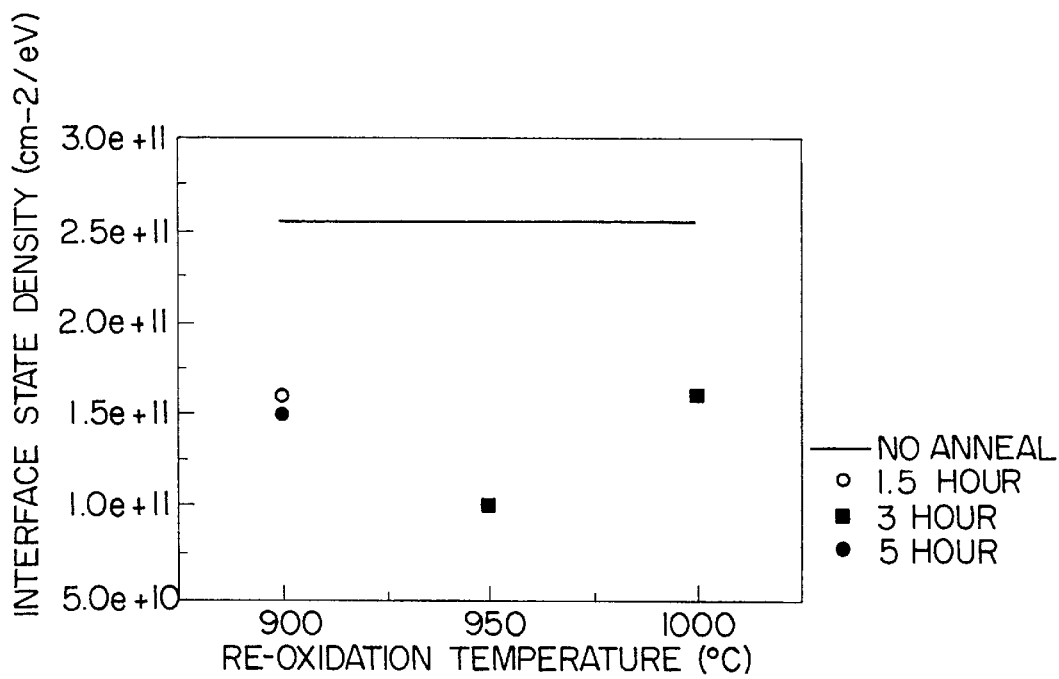
FIG. 6 is a comparison of interface state densities on oxides grown at 1050° C., and then re-oxidized at 900°, 950° and 1000° C.

FIGS. 5 and 6 demonstrate the net oxide charge and interface state densities of samples oxidized at 1050° C. Re-oxidation anneal temperatures from 900° C. to 1000° C. and anneal times of 1.5, 3 and 5 hours were investigated. Again, the horizontal line indicates the quality level of samples oxidized under the same conditions, but which received no re-oxidation anneal.

For the oxides grown at 1050° C., the net oxide charge density changes dramatically with increased oxidation time, as seen by comparing the two data points at 900° C. in FIG. 5. Even with the longer, 5 hour time at 900° C, however, the 950° C. re-oxidation anneal for 3 hours is still comparable. The interface state density, however, is not dramatically affected by the re-oxidation anneal time, as seen by comparing the two 900° C. anneal times in FIG. 6. The largest re-oxidation anneal variable for the oxides grown at 1050° C. is the anneal temperature, which appears to be optimal at around 950° C. Net oxide charge is decreased by as much as a factor of 2, while interface states are decreased by as much as a factor of 2.5.

For both the oxides grown at 1050° C. and at 1100° C., the optimal temperature for the re-oxidation anneal is 950° C. Increased anneal time also improves the oxide quality, but this is a secondary effect compared to the temperature. The optimal re-oxidation, at 950° C., dramatically reduces the net oxide charge and interface states, even for oxides grown at the optimal temperature, 1050° C.

Reoxidation Anneal on Deposited Oxides

Poor dielectric strength has been associated with deposited oxides, which is usually blamed on their silicon rich stoichiometry. Silicon carbide has the distinct advantage of oxidizing only at extremely high temperatures, which would allow the deposited oxide to be "re-oxidized". This can be done by annealing the deposited oxide in an oxidizing environment at a temperature high enough to oxidize any silicon in the oxide, but low enough that no significant oxidation of SiC occurs. This step not only allows for good densification of the oxide, it also allows for the formation of a thermal SiO$_2$ interface without consuming any significant amount of SiC or introducing carbon into the oxide.

Figure 7:
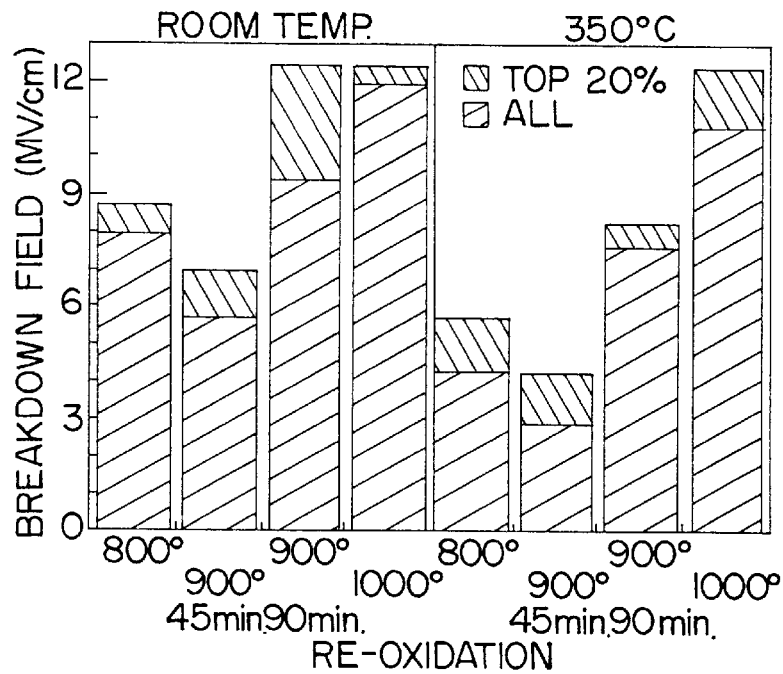
FIG. 7 is a bar graph of dielectric breakdown strengths of deposited oxides after different re-oxidation conditions.

The dielectric strengths of deposited oxides at room temperature and 350° C. are illustrated in FIG. 7. The highest dielectric strength of the samples re-oxidizing at 1000° C. was a surprisingly high 12.4 MV/cm. This is higher than the intrinsic SiO$_2$ dielectric strength of 11.3 MV/cm, but the excess could be due to the metal/SiC work function difference or net oxide charge densities that are not considered in the calculated field.

As demonstrated in FIG. 7, the 1000° C. re-oxidation condition produces the highest dielectric strengths. Although the highest breakdown field is unaltered from room temperature to 350° C., the distribution is broader, as indicated by the striped cap which represents the range of the top 20% of the breakdown fields. The samples re-oxidized at 800° and 900° C. have lower fields which are reduced even further at 350° C. The sample oxidized for 90 minutes at 900° C. was better than the sample oxidized for only 45 minutes. This behavior is consistent with excess silicon being present in deposited oxides, which can then be oxidized to achieve correct stoichiometry in the oxide layer.

Figure 8:
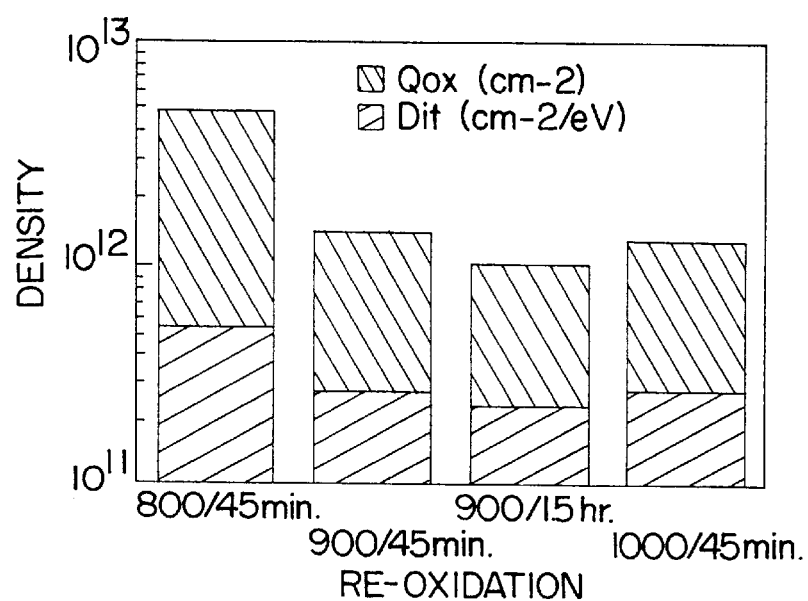
FIG. 8 is a plot of oxide charge and interface state densities versus reoxidation time and temperature.

The interface state densities and net oxide charge densities of these samples are plotted for each of these samples in FIG. 8. Again, better quality is achieved with more oxidation. Both the net oxide charge and the interface state densities decrease with increased time and temperature. Interface state densities are in the 2–3×10$^{11}$ cm$^{-2}$eV$^{-1}$ range, while net oxide charge is about 1×10$^{12}$ cm$^{-2}$ for the samples which received the 1000° C. re-oxidation.

In summary, the reoxidation anneal has been demonstrated to dramatically improve the quality of both the deposited and thermal oxides. The breakdown field problem with which deposited oxides have historically been plagued is effectively eliminated with a re-oxidation anneal. The net oxide charge is also greatly improved, and oxides can repeatedly be made with a net oxide charge density of $1\times10^{12}$ cm$^{-2}$. Interface state densities of $1\times10^{11}$ cm$^{-2}$eV$^{-1}$ are now commonly produced using the invention. Compared with prior oxidation procedures (e.g. at 1150° C. with no re-oxidation), net oxide charge has been lowered by a factor of 3, while interface states have been improved by an order of magnitude. These process improvements result in the largest reduction in the net oxide charge and interface state densities reported to date.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of obtaining oxide layers on silicon carbide and resulting improved performance from oxide based silicon carbide devices, the method comprising:

preparing the surface of a silicon carbide layer for an oxidation layer;

producing an oxide layer on the prepared silicon carbide surface; and thereafter exposing the oxide layer and the underlying silicon carbide layer to an oxidizing source gas at a temperature of between about 600 and 1000° C., and while avoiding any substantial additional oxidation of the silicon carbide under the oxide layer, and for a time sufficient to densify the oxide layer and improve the interface between the oxide layer and the underlying silicon carbide layer.

2. A method according to claim 1 wherein the step of producing the oxide layer comprises thermally oxidizing the silicon carbide layer at temperatures of between about 1050° and 1300° C.

3. A method according to claim 1 wherein the step of producing the oxide layer comprises thermally oxidizing the carbon face of the silicon carbide layer at temperatures of between about 1000° and 1300° C.

4. A method according to claim 1 wherein the step of producing the oxide layer comprises thermally oxidizing the silicon face of the silicon carbide layer at temperatures if between about 1000° and 1400° C.

5. A method according to claim 1 wherein the step of producing the oxide layer comprises depositing an oxide layer on the silicon carbide layer.

6. A method according to claim 1 wherein the step of producing the oxide layer comprises sputter depositing the oxide layer.

7. A method according to claim 1 wherein the step of producing the oxide layer comprises plasma depositing the oxide layer.

8. A method according to claim 1 wherein the step of producing the oxide layer comprises producing an oxynitride layer.

9. A method according to claim 1 wherein the step of exposing the oxide and silicon carbide to the oxidizing source gas comprises exposing an oxide layer on a silicon carbide epitaxial layer.

10. A method according to claim 1 wherein the step of exposing the oxide and silicon carbide to the oxidizing source gas comprises exposing an oxide layer on a silicon carbide substrate.

11. A method according to claim 1 wherein the step of exposing the oxide and underlying silicon carbide layer to an oxidizing source gas comprises exposing the oxide and silicon carbide to an oxidizing source gas at a temperature of between about 800° and 1000° C.

12. A method according to claim 1 wherein the step of exposing the oxide and silicon carbide to an oxidizing source gas comprises exposing the oxide and silicon carbide to an oxygen-containing gas that does not otherwise interfere with the chemical, physical, or electronic characteristics of either of the oxide or silicon carbide layers.

13. A method according to claim 1 wherein the step of exposing the oxide and silicon carbide to an oxidizing source gas comprises exposing the oxide and silicon carbide to a gas selected from the group consisting of: oxygen, water vapor, oxygen in water vapor, water vapor a in carrier gas, compounds of nitrogen and oxygen, and mixtures thereof.

14. A method of obtaining oxide layers on silicon carbide and resulting improved performance from oxide based silicon carbide devices, the method comprising:

preparing the surface of a silicon carbide layer for an oxidation layer;

thermally oxidizing the prepared layer of silicon carbide at a temperature of between about 1050° and 1100° C. to produce an oxide layer on the layer of silicon carbide; and thereafter exposing the oxide layer and the underlying silicon carbide layer to an oxidizing source gas at a temperature between about 600 and 1000° C., and while avoiding any substantial additional oxidation of the silicon carbide, and for a time sufficient to densify the oxide layer and improve the interface between the oxide layer and the underlying silicon carbide layer.

15. A method according to claim 14 wherein the step of thermally oxidizing a silicon carbide layer comprises thermally oxidizing a silicon carbide epitaxial layer.

16. A method according to claim 14 wherein the step of thermally oxidizing a silicon carbide layer comprises thermally oxidizing a silicon carbide substrate.

17. A method according to claim 14 wherein the step of exposing the oxide and silicon carbide to an oxidizing source gas comprises exposing the oxide and silicon carbide to an oxidizing source gas at a temperature of about 950° C.

18. A method according to claim 14 wherein the step of exposing the oxide and silicon carbide to an oxidizing source gas comprises exposing the oxide and silicon carbide to an oxygen-containing gas that does not otherwise interfere with the chemical, physical, or electronic characteristics of either of the oxide or silicon carbide layers.

19. A method according to claim 14 wherein the step of exposing the oxide and silicon carbide to an oxidizing source gas comprises exposing the oxide and silicon carbide to a gas selected from the group consisting of: oxygen, water vapor, oxygen in water vapor, water vapor in a carrier gas, compounds of nitrogen and oxygen, and mixtures thereof.

20. A method according to claim 14 and further comprising the step of annealing the oxide layer in an argon atmosphere prior to the step of exposing the layers to an oxidizing source gas.

21. An improved silicon carbide and oxide structure comprising:

a silicon carbide substrate; and an oxide layer on the silicon carbide substrate, said oxide layer having an interface state density less than $1.6 \times 10^{11}$ per square centimeter per electron-volt ($cm^{-2}/eV$).

22. A silicon carbide and oxide structure according to claim 21 wherein said interface state density is less than $1.5 \times 10^{11}$ $cm^{-2}/eV$.

23. A silicon carbide and oxide structure according to claim 21 wherein said interface state density is less than $1.1 \times 10^{11}$ $cm^{-2}/eV$.

24. A silicon carbide and oxide structure according to claim 21 wherein said silicon carbide layer is a single crystal with a polytype selected from the group consisting of 2H, 3C, 4H, 6H, and 15R.

25. A silicon carbide and oxide structure according to claim 21 wherein said silicon carbide layer is an epitaxial layer.

26. A silicon carbide and oxide structure according to claim 21 wherein said silicon carbide layer is a substrate.

27. A silicon carbide and oxide structure according to claim 21 wherein said oxide layer is predominantly silicon dioxide.

28. An improved silicon carbide and oxide structure comprising:

a silicon carbide substrate; and an oxide layer on the silicon carbide substrate, said oxide layer having an oxide charge less than $2.5 \times 10^{12}$ $cm^{-2}$.

29. A silicon carbide and oxide structure according to claim 28 wherein said oxide charge is less than $1.5 \times 10^{12}$ $cm^{-2}$.

30. A silicon carbide and oxide structure according to claim 28 wherein said oxide charge is less than $1.1 \times 10^{12}$ $cm^{-2}$.

31. A silicon carbide and oxide structure according to claim 28 wherein said silicon carbide layer is a single crystal with a polytype selected from the group consisting of 3C, 4H, 6H, and 15R.

32. A silicon carbide and oxide structure according to claim 28 wherein said silicon carbide layer is an epitaxial layer.

33. A silicon carbide and oxide structure according to claim 28 wherein said silicon carbide layer is a substrate.

34. A silicon carbide and oxide structure according to claim 28 wherein said oxide layer is predominantly silicon dioxide.

\* \* \* \* \*